United States Patent [19]

Sugihara et al.

[11] Patent Number: 5,075,200

[45] Date of Patent: Dec. 24, 1991

[54] PROCESS OF FORMING SUPERCONDUCTIVE WIRING STRIP

[75] Inventors: Tadashi Sugihara; Yoshio Murakami; Takuo Takeshita, all of Saitama, Japan

[73] Assignee: Mitsubishi Metal Corporation, Tokyo, Japan

[21] Appl. No.: 415,215

[22] PCT Filed: Dec. 23, 1988

[86] PCT No.: PCT/JP88/01310

§ 371 Date: Aug. 24, 1989

§ 102(e) Date: Aug. 24, 1989

[87] PCT Pub. No.: WO89/06441

PCT Pub. Date: Jul. 13, 1989

[30] Foreign Application Priority Data

Dec. 25, 1987 [JP] Japan ................. 62-332980

[51] Int. Cl.$^5$ ............ C04B 35/56; C04B 35/80; G03C 5/00
[52] U.S. Cl. .......................... 430/315; 505/1
[58] Field of Search ............. 505/1; 430/315

[56] References Cited

U.S. PATENT DOCUMENTS 4,879,270 11/1989 Maxfield et al. ............ 505/1
4,933,318 6/1990 Heijman ................... 505/1

Primary Examiner—Charles L. Bowers, Jr.
Assistant Examiner—Ashley I. Pezzner
Attorney, Agent, or Firm—Sughrue, Mion, Zinn, Macpeak & Seas

[57] ABSTRACT

A process of forming a superconductive wiring strip incorporates a deposition of a raw material on a mask layer followed by a lift-off stage for patterning the wiring strip, and the mask layer is formed for the miniature wiring strip by using lithographic techniques.

10 Claims, 5 Drawing Sheets

PROCESS OF FORMING SUPERCONDUCTIVE WIRING STRIP

TECHNICAL FIELD

This invention relates to a process of forming a superconductive wiring strip and, more particularly, to a superconductive wiring strip used for fabrication of, for example, a thick film integrated circuit or a thin film integrated circuit.

BACKGROUND ART

Conventionally, the structure disclosed in "Techniques of Forming Superconductive Wiring Strip on Alumina Substrate", Electronic Parts and Materials, 1987 November, pages 89 through 92, published by Association of Industrial Investigation, is known as a typical example of the structure of the superconductive wiring strip of such an integration usage.

The superconductive wiring strip is formed on a substrate by using thick film printing techniques. In detail, a bulk solid of a superconductive ceramic material is pulverized into a powder of the superconductive ceramic material, a paste made from the powder is patterned on a high purity alumina substrate (which is known as "Fine Grained Alumina substrate" and abbreviated to "FGA") by using a screen printing technique, and, then, the patterned paste is sintered. In this way, the superconductive wiring strip is formed by using the screen printing technique.

However, since the wiring pattern is formed on the substrate by using the screen printing technique in the prior art process of forming the superconductive wiring strip, a problem is encountered in that miniature pattern geometries are hardly developed. For example, the screen printing technique is merely capable of producing conductive patters with a feature size as well as a tolerance fallen within a range between 50 microns and 100 microns.

It is therefore an object of the present invention to provide a process of forming a miniature wiring pattern of a superconductive material.

DISCLOSURE OF INVENTION

In accordance with the present invention, a process of forming a superconductive wiring strip comprises the steps of preparing an insulating layer and a raw material containing at least one element selected from the group consisting of scandium, yttrium and lanthanides, at least one alkaline earth metal and copper, forming a mask layer used for a formation of a wiring pattern on the insulating layer by using lithographic techniques, covering the mask layer and an exposed portion of the insulating layer with the raw material, thereby forming a raw material layer, leaving a part of the raw material layer and removing the other part of the raw material layer on the insulating layer by striping off the mask layer, and oxidizing the part of the raw material layer for producing the superconductive wiring strip.

The raw material may contain a plurality of elements selected from the group consisting of scandium, yttrium and lanthanides, a plurality of alkaline earth metals and copper. In the step of forming the mask layer, a photoresist is, by way of example, applied on the insulating layer, and a photo-mask image is transferred on the photoresist during an exposure, then being developed by a partial etching of the photoresist. For an improvement of the resolution in the formation of the mask layer, a radiation selected from the spectrum between a short-wavelength visible radiation and a near-ultraviolet radiation as well as any one of a deep ultraviolet radiation, an electron beam radiation, an x-ray radiation and an ion beam radiation may be available.

The raw material layer may be deposited by using any one of a vacuum evaporation technique, a sputtering technique, an ion plating technique and so on.

As described hereinbefore, the lithographic techniques are employed in the present invention for the formation of the wiring pattern, and, for this reason, a miniature wiring strip is easily produced. The superconductive ceramic wiring strip by way of example is about 0.5 to 1 micron in width. If a superconductive material of the yttrium-barium-copper-oxygen system is used for the superconductive wiring strip, the current density is increased.

BEST MODE FOR CARRYING OUT THE INVENTION

Description is hereinunder made for examples of the present invention.

FIGS. 1 to 6 are cross sectional views showing the steps forming parts of a first example according to the present invention.

The present invention pertains to a process sequence for forming a thick film wiring strip on a high purity alumina substrate.

The process sequence starts with preparation of a raw material containing at least one element selected from the group consisting of scandium, yttrium and lanthanides, at least one alkaline earth metal such as, for example, calcium, strontium, barium or radium and copper and with preparation of an alumina substrate 1 serving as an insulating layer. By the way, oxygen may be contained in the raw material due to, for example, the natural oxidation, however, no oxygen is intentionally introduced therein.

Figure 1:
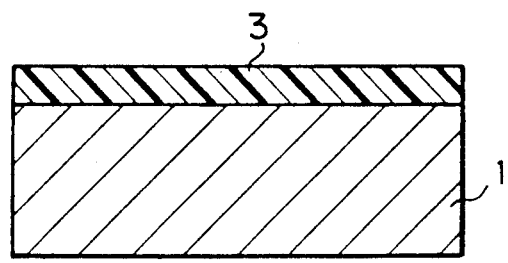
FIGS. 1 to 6 show the steps of a first example of a process of forming a superconductive wiring strip according to the present invention, respectively.

Subsequently, on the high purity alumina substrate 1 is applied an appropriate photosensitive material which is about 10 microns in thickness to form a photoresist film 3. In detail, a few drops of liquid photosensitive material are spread over the substrate 1 by a spin coating at about 5000 r.p.m. to form a thin uniform photosensitive film. The photosensitive film is baked to provide the photoresist film 3 on the substrate 1. The resultant structure of this stage is shown in FIG. 1.

Figure 2:
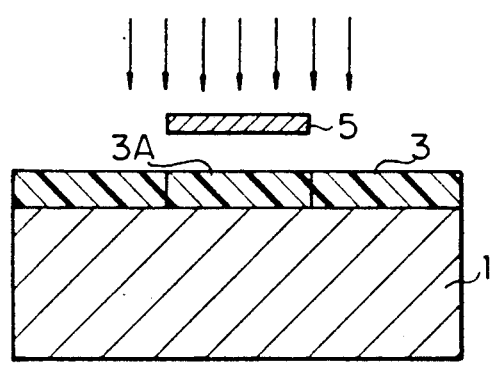

As illustrated in FIG. 2, a photo-mask 5 featured in a predetermined wiring pattern image is placed over the photoresist film 3, and an ultraviolet light is, by way of example, radiated from the upper side of the photomask 5 as indicated by arrows. As a result, the photoresist film 3 except for a portion 3A beneath the photomask 5 is exposed to the ultraviolet light, and, accordingly, the predetermined wiring pattern image is transferred to the photoresist film 3.

Figure 3:
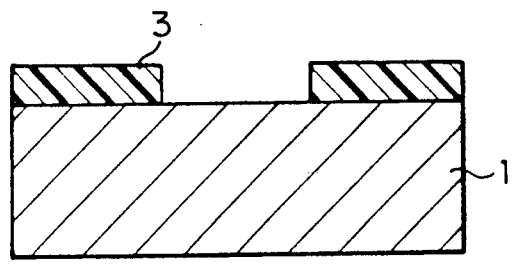

When the photoresist film 3 with the transferred wiring pattern image is soaked in a developing solution, the non-exposed portion 3A is removed into the developing solution. and, then, the negative image is produced in the photoresist film 3, thereby allowing the upper surface of the substrate 1 to be partially exposed. The resultant structure of this stage is shown in FIG. 3.

Figure 4:
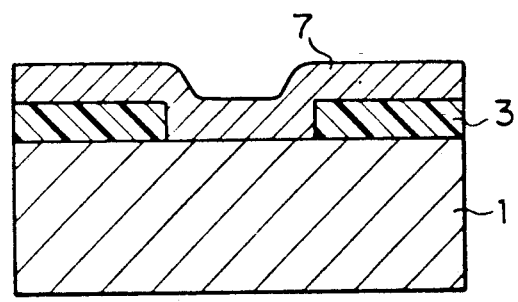

In this way, when the mask layer (of the photoresist film) 3 is patterned on the substrate 1 for forming the wiring patter, the raw material prepared in the preparation stage is deposited on the mask layer 3 for the wiring pattern as well as the exposed surface of the substrate 1, and, accordingly, a raw material film 7 is formed to a thickness of about 10 microns as shown in FIG. 4. The raw material film 7 is, by way of example, formed by using any one of a vacuum evaporation technique, a sputtering technique, a resistance heating evaporation technique on an ion plating technique. For example, if an RE sputtering technique is used for the formation of the raw material film 7, the structure shown in FIG. 3 is placed in an argon ambient of a pressure ranging between about $10^{-4}$ torr and about $10^{-1}$ torr, and the distance between a target of the raw material and the substrate 1 is adjusted to be about 70 millimeters. The sputtering is carried out at about 200 watts.

Figure 5:
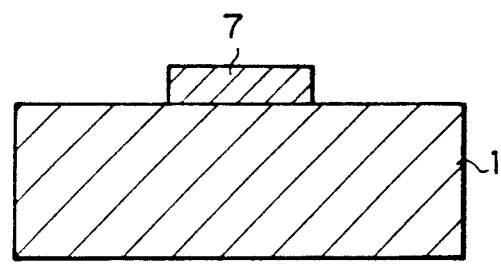

Subsequently. the mask layer 3 is stripped from the substrate 1. As a result, a portion of the raw material film 7 on the mask layer 3 is removed from the substrate 1 together with the mask layer 3. However, the other portion of the raw material film 7 directly deposited on the substrate 1 is left on the substrate 1. The resultant structure of this stage is shown in FIG. 5.

Figure 6:
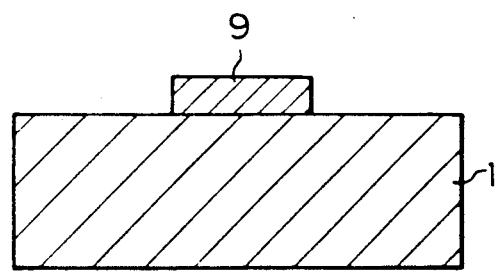

The raw material film 7 left on the substrate 1 is placed in a predetermined oxidation ambient, and. finally, a superconductive ceramic wiring strip 9 is produced. For example, the oxidation is carried out in an oxygen ambient at a temperature ranging between about 750 degrees and about 850 degrees in centigrade for a time period ranging from about an hour to about 5 hours. As illustrated in FIG. 6, on the substrate 1 is formed the superconductive wiring strip 9 which has a predetermined composition in, for example, the yttrium-barium-copper-oxygen system.

In addition, the superconductive wiring strip 9 may be formed of a superconductive ceramic material represented by the molecular formula of $(Gd_{0.5}Ho_{0.5})_{1.0}(Ba_{0.9}Sr_{0.1})_{2.0}Cu_{3.0}O_{6.9}$. In this case, the raw material is composed of the elements of the above superconductive ceramic material except for oxygen. The elimination of oxygen means that no oxygen is intentionally introduced therein. but the raw material may contain oxygen introduced by the natural oxidation.

FIGS. 7 to 11 show the steps of a second example according to the present invention. In the second example. the present invention appertains to a formation of an internal wiring strip incorporated in a thin film integrated circuit.

Figure 7:
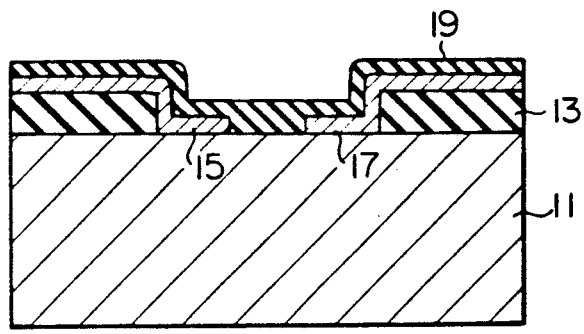
FIGS. 7 to 11 show the steps of a second example of a process of forming a superconductive wiring strip according to the present invention.

In FIG. 7. reference numeral 11 designates a silicon substrate, and the substrate 11 is covered with an insulating film 13 of (a silicon oxide represented by the molecular formula of $SiO_2$), however, a part of the insulating film 13 is selectively removed. On the surface of the substrate 11 thus exposed from the insulating film 13 are provided a source electrode 15 and a drain electrode 17 which are formed of a superconductive material and spaced apart from each other by a distance of about 0.5 micron. These electrodes 15 and 17 as well as the surface of the substrate 11 therebetween are covered with an insulating film 19 of (a silicon oxide represented by the molecular formula of $SiO_2$).

In this instance. on the insulating film 19 a gate electrode (or a wiring strip) is formed of a superconductive ceramic material.

The formation process starts with a preparation of a raw material which may be similar to that used in the above example.

Figure 8:
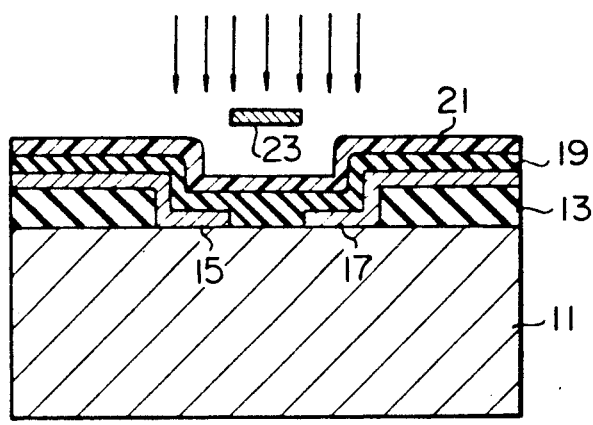
Figure 9:
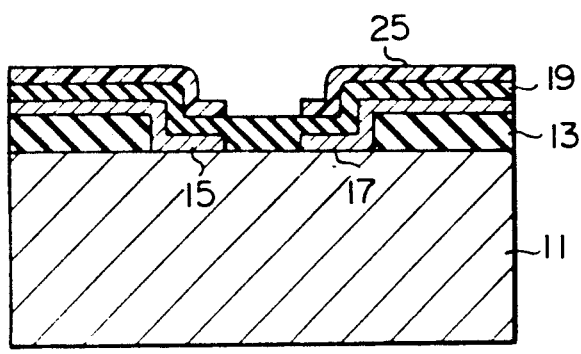

Onto the insulating film 19 of the silicon oxide is spin a photosensitive material which provides a photoresist film 21 of a predetermined thickness as shown in FIG. 8. The photoresist film 21 is exposed through a mask 23 with a predetermined wiring pattern image and, then, developed for patterning a mask layer 25 for the wiring strip on the insulating film 19. The resultant structure of this stage is shown in FIG. 9.

In other words, the photosensitive film 21 is patterned by using a sequence of the lithographic techniques and serves as the mask layer 25 for the formation of the wiring strip. The developing solution removing the photosensitive material 21 is an organic solvent such as, for example, xylene.

Figure 10:
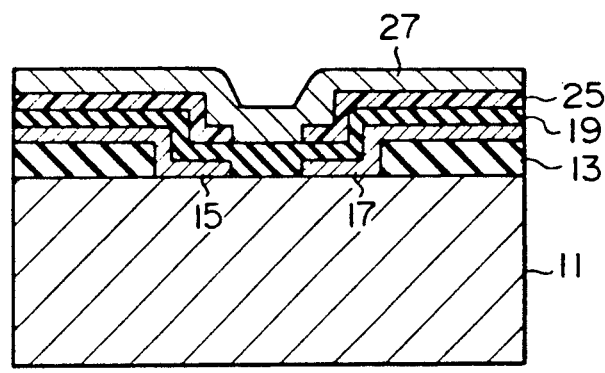

After this stage, the raw material is deposited to a predetermined thickness on the mask layer 25 and the insulating film 19 partially exposed from the mask layer 25 by using, for example, an evaporation technique, then a raw material film 27 is formed as illustrated in FIG. 10.

Figure 11:
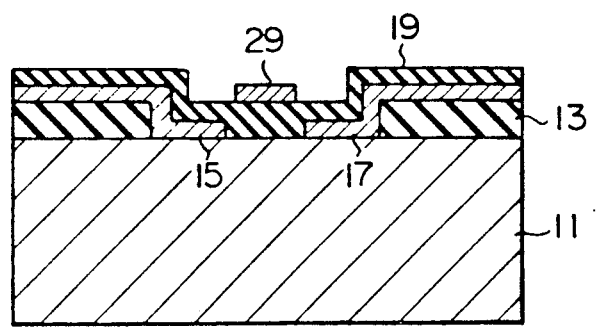

When the mask layer 25 is stripped off, a part 29 of the raw material film 27 is left on the insulating film 19, and, accordingly, the wiring pattern image is transferred to the raw material film as shown in FIG. 11.

Finally, the raw material film 29 left thereon is oxidized to form the wiring strip. the wiring strip serves as the gate electrode.

INDUSTRIAL APPLICABILITY

A process of forming a superconductive wiring strip according to the present invention is available for forming a wiring strip used for fabrication of a thick film integrated circuit as well as a thin film integrated circuit.

What is claimed is:

1. A process for forming a superconductive wiring strip comprising the steps of
   preparing an insulating layer,
   preparing a raw material containing at least one element. at least one alkaline earth metal and copper, said at least one element being selected from the group consisting of scandium, yttrium and lanthanides,
   forming a mask layer used for a formation of a wiring pattern on said insulating layer by using lithographic techniques,
   covering said mask layer and an exposed portion of said insulating layer with said raw material, thereby forming a raw material layer,
   leaving a part of said raw material layer and removing the other part of said raw material layer on said insulating layer by striping off said mask layer, and
   oxidizing the part of said raw material layer for producing said superconductive wiring strip.

2. A process of forming a superconductive wiring strip as set forth in claim 1. in which said insulating layer serves as a substrate for fabricating a thick film integrated circuit.

3. A process of forming a superconductive wiring strip as set forth in claim 2. in which said wiring pattern is transferred with an optical radiation selected from short-wavelength visible radiations, near-ultraviolet radiations, deep-ultraviolet radiations in said lithographic techniques.

4. A process of forming a superconductive wiring strip as set forth in claim 2, in which said wiring pattern is transferred with a beam radiation selected from electron beam radiations, x-ray beam radiations, and ion beam radiations.

5. A process of forming a superconductive wiring strip as set forth in claim 3, in which said raw material is deposited on said mask layer and said exposed portion of said insulating layer by using a technique selected from the group consisting of a vacuum evaporation technique, a sputtering technique, resistance heating evaporation technique and an ion plating technique for covering therewith.

6. A process of forming a superconductive wiring strip as set forth in claim 5, in which said raw material layer is oxidized in an oxygen ambient at a temperature ranging between about 750 degrees and about 850 degrees in centigrade for a time period ranging from about an hour to about 5 hours.

7. A process of forming a superconductive wiring strip as set forth in claim 6, in which said wiring strip is formed of an yttrium-barium-copper oxide.

8. A process of forming a superconductive wiring strip as set forth in claim 1, in which said insulating layer forms a part of a multiple-layer structure for a thin film integrated circuit.

9. A process of forming a superconductive wiring strip as set forth in claim 8, in which said wiring strip serves as a gate electrode of a transistor.

10. A process of forming a superconductive wiring strip comprising the steps of:
preparing an insulating layer,
preparing a raw material containing a plurality of element, a plurality of alkaline earth metals and copper, each of said element being selected from the group consisting of scandium, yttrium and lanthanides,
forming a mask layer used in a formation of a wiring pattern on said insulating layer by using lithographic techniques,
covering said mask layer and an exposed portion of said insulating layer with said raw material, thereby forming a raw material layer,
removing a part of said raw material layer and leaving the other part of said raw material layer on said insulating layer by a removal of said mask layer, and
oxidizing the other part of said raw material layer for producing a superconductive ceramic wiring strip.

* * * * *